United States Patent
Liu

(10) Patent No.: US 6,509,207 B1
(45) Date of Patent: Jan. 21, 2003

(54) SOLDERING METHOD AND APPARATUS FOR A CHIP AND ELECTRONIC DEVICES

(75) Inventor: Sheng-Tsung Liu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/055,272

(22) Filed: Jan. 22, 2002

(51) Int. Cl.$^7$ ................................................ H01L 21/44
(52) U.S. Cl. ........................ 438/108; 438/119; 438/612; 438/613; 438/614; 438/615
(58) Field of Search ................................ 438/108, 119, 438/612–615; 257/737–738, 772, 779, 781, 784; 228/180.21, 180.22

(56) References Cited

U.S. PATENT DOCUMENTS

| | | | | |
|---|---|---|---|---|
| 5,341,980 A | * | 8/1994 | Nishikawa et al. | .... 228/180.21 |
| 5,878,943 A | * | 3/1999 | Nishikawa et al. | .... 228/180.22 |
| 5,902,686 A | * | 5/1999 | Mis | ........................ 228/180.22 |
| 6,162,652 A | * | 12/2000 | Dass et al. | .................. 438/613 |
| 6,179,198 B1 | * | 1/2001 | Eifuku et al. | .......... 228/180.22 |
| 6,227,436 B1 | * | 5/2001 | Nishikawa et al. | .... 228/180.22 |

* cited by examiner

Primary Examiner—Richard Booth
Assistant Examiner—Lynne A. Gurley
(74) Attorney, Agent, or Firm—Kolisch Hartwell, P.C.

(57) ABSTRACT

A soldering method for attaching a chip and electronic devices to a chip carrier has a lengthening reflowing time when attaching the electronic devices. Because the pins of the electronic device connect to the chip carrier by solder, the solder between the electronic device and the chip carrier are oxidized, which forms a high melting point oxide layer on a surface of the solder. Therefore the solder connecting the electronic device with the chip carrier ensures that the electronic devices do not move on the chip carrier in the follow-up high temperature processes.

7 Claims, 2 Drawing Sheets

SOLDERING METHOD AND APPARATUS FOR A CHIP AND ELECTRONIC DEVICES

BACKGROUND OF THE INVENTION

1. Field of the Invention

The present invention relates to a soldering method and apparatus for a chip and electronic devices, and more particularly to a method that attaches an electronic device and a chip to a chip carrier.

2. Description of Related Art

A new method has been developed for IC packaging in which a chip and electronic device are soldered on the same chip carrier. Using the electronic device makes the operation of the chip stable and normal.

In this packaging process, the electronic devices are soldered first on pads of the chip carrier. There is a big problem in this process. The electronic devices are able to shift from the pads during the process of packaging the IC. The chip is soldered on the chip carrier after the electronic device is attached to the chip carrier, so the solder attaching the electronic device with the chip carrier is melted in the follow-up high temperature processes such as the wire bonding and molding. Therefore the electronic devices can move from the original position of the pads, and even cause the electronic device to disconnect from the pads. Thus the operation of the chip becomes unstable.

Therefore, an objective of the present invention is to provide an improved method of attaching an electronic device and a chip to a chip carrier to mitigate and/or obviate the aforementioned problems.

SUMMARY OF THE INVENTION

The main objective of the present invention is to provide a soldering method that ensures the electronic device is properly attached to the chip carrier, together with a chip.

Other objects, advantages and novel features of the invention will become more apparent from the following detailed description when taken in conjunction with the accompanying drawings.

DETAILED DESCRIPTION OF THE PREFERRED EMBODIMENT

Figure 1:
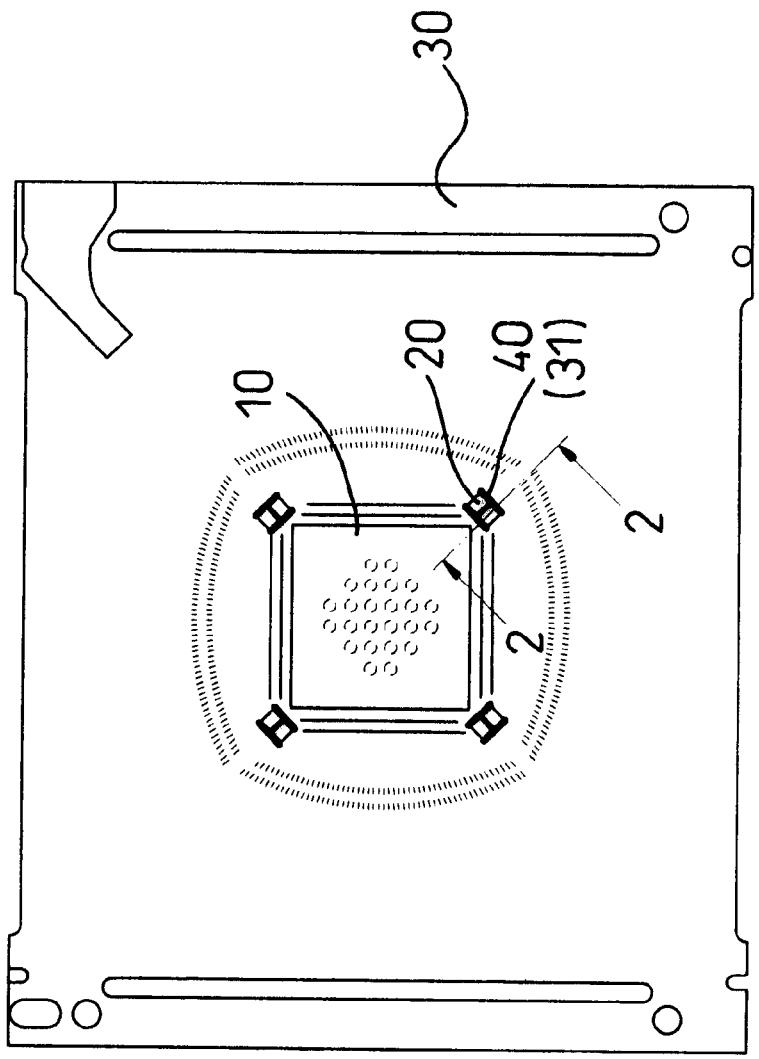
FIG. 1 is top view of a chip carrier with the electronic devices and a chip in accordance with the present invention.
Figure 2:
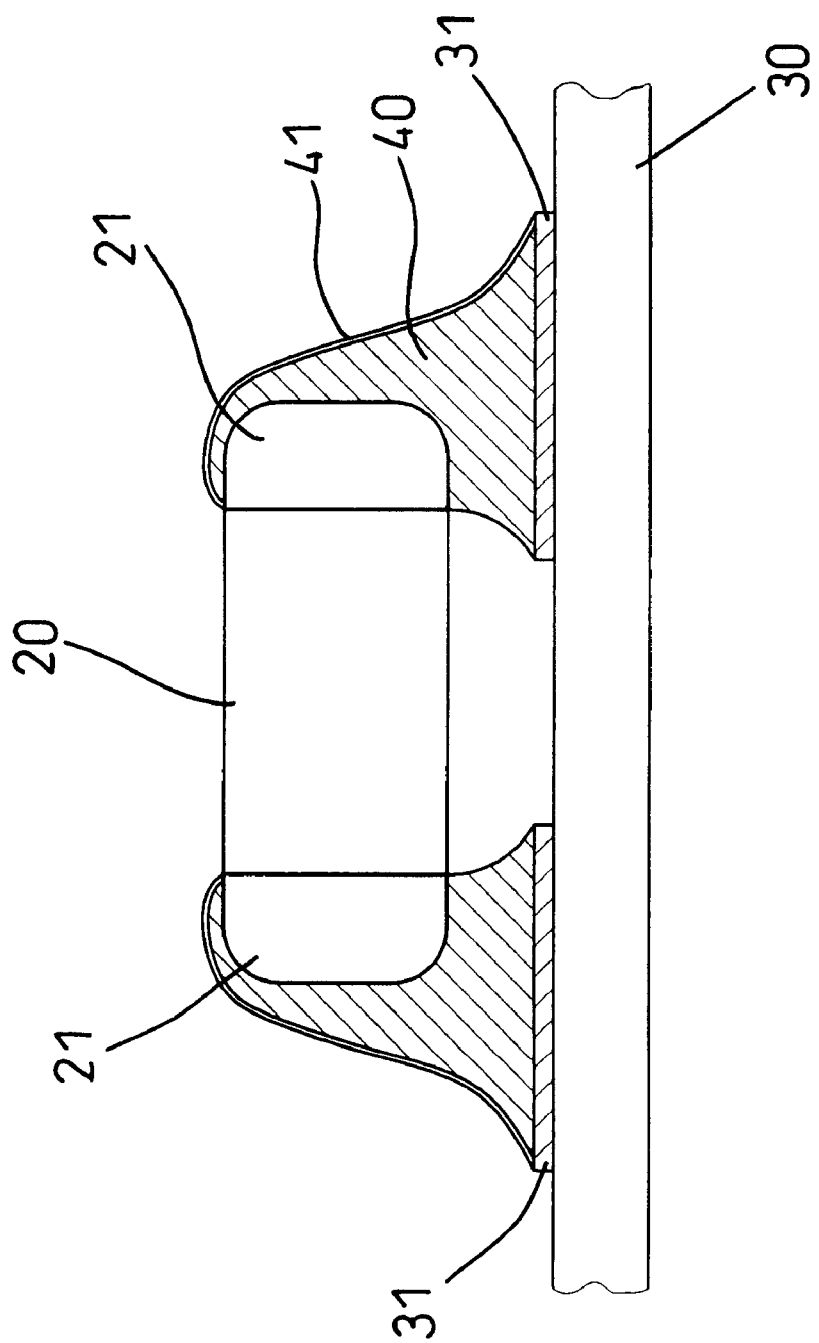
FIG. 2 is cross sectional side plan view along line 2—2 in FIG. 1 of an electronic device attached to a chip carrier.

With reference to FIGS. 1 and 2, a chip (10) and electronic devices (20) are soldered on a chip carrier (30) that may be a leadframe, film, substrate or ceramic substrate. The chip carrier (30) has a top and a bottom face. Multiple pads (31) are formed on the top face of the chip carrier (30) to connect to the chip (10) and pins (21) of the electronic devices (20).

One electronic device (20) is connected to solder pads (31) of the chip carrier (30) by the solder (40) using a soldering method in accordance with the present invention. The soldering method in accordance with the present invention comprises the following steps:

attaching the electronic device (20) onto the corresponding pads (31) of the chip carrier (30) by the solder (40), wherein the pins (21) of electronic device (20) are connected to the pads (31) of the chip carrier (30) via the soldering process;

reflowing the chip carrier (30) with the electronic device (20) in the reflow oven (not shown) for heating and melting the solder (40) to secure the electronic device (20) on pads on the chip carrier (30), and an oxide layer (41) is formed on a surface of the solder (40); and lengthening a heating time of the reflowing chip carrier, wherein a thickness of the oxide layer (41) is increased to prevent the solder (40) from being melted in follow-up high temperature processes.

Because the oxide layer (41) has a high melting point, the oxide layer (41) is able to prevent the electronic device (20) from shifting from the original position of the pads (31) in the follow-up processes such as wire bonding, molding processes, etc. that have a high temperature. For example, if a solder (40) with a ratio of Sn to Pb is 67 to 73 is used to attach the electronic device (20) to the pads (31), a 100 angstrom thickness of the oxide layer (41) formed on the outer surface of the solder (40) during the lengthening a heating time step has a melting point of about 300° C. After soldering the electronic devices (20) on the chip carrier (30), the chip (20) has to be soldered on the chip carrier (30), too. That is, the chip (10) has to be connected to the chip carrier (30) with the electronic device (20) in processes that reach temperatures of 170~175° C. Because of the fixed thickness of the oxide layer (41) formed on the solder (40), the solder holding the electronic device (20) is kept from flowing, and further shifts from the pads (31) of the chip carrier (30) are prevented.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A soldering method for a chip and electronic devices comprising:

attaching electronic devices onto corresponding pads of a chip carrier by a soldering process, wherein solder are provided to connect the electronic devices with the pads of the chip carrier;

reflowing the solder to ensure that the electronic devices are attached fixedly onto the pads, wherein an oxide layer is formed on a surface of the solder; and lengthening a reflowing time, wherein a thickness of the oxide layer is increased to prevent the solder from being melted in follow-up high temperature processes.

2. The method as claimed in claim 1, wherein the thickness of the oxide layer is 100 angstrom.

3. The method as claimed in claim 1, wherein the solder has a ratio of Sn to Pb is 67 to 73.

4. The method as claimed in claim 1, wherein the chip carrier is a substrate.

5. The method as claimed in claim 1, wherein the chip carrier is a leadframe.

6. The method as claimed in claim 1, wherein the chip carrier is a film.

7. The method as claimed in claim 1, wherein the chip carrier is a ceramic substrate.

* * * * *